(12) United States Patent
Li et al.

(10) Patent No.: US 11,251,132 B1
(45) Date of Patent: Feb. 15, 2022

(54) INTEGRATED TYPE MIS SUBSTRATE FOR THIN DOUBLE SIDE SIP PACKAGE

(71) Applicant: Dialog Semiconductor (UK) Limited, London (GB)

(72) Inventors: Chehan Jerry Li, Taichung (TW); Jesus Mennen Belonio, Jr., Neubiberg (DE); Shou-Cheng Eric Hu, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 228 days.

(21) Appl. No.: 16/535,222

(22) Filed: Aug. 8, 2019

(51) Int. Cl.
| | |
|---|---|
| *H01L 21/48* | (2006.01) |
| *H01L 23/00* | (2006.01) |
| *H01L 23/538* | (2006.01) |
| *H01L 21/56* | (2006.01) |
| *H01L 23/31* | (2006.01) |

(52) U.S. Cl.
CPC ...... *H01L 23/5383* (2013.01); *H01L 21/4857* (2013.01); *H01L 21/565* (2013.01); *H01L 23/3128* (2013.01); *H01L 23/5386* (2013.01); *H01L 23/5389* (2013.01); *H01L 24/13* (2013.01); *H01L 24/16* (2013.01)

(58) Field of Classification Search
CPC .............. H01L 23/5383; H01L 21/565; H01L 23/5389; H01L 21/4857; H01L 23/3128; H01L 23/5386; H01L 21/56
See application file for complete search history.

(56) References Cited

U.S. PATENT DOCUMENTS

| | | | |
|---|---|---|---|
| 8,581,405 B2 | 11/2013 | Dertinger et al. | |
| 9,565,774 B2 | 2/2017 | Lee | |
| 9,711,502 B2 | 7/2017 | Huang et al. | |
| 10,204,863 B2 | 2/2019 | Chen et al. | |
| 10,276,424 B2 | 4/2019 | See et al. | |
| 2016/0174381 A1 | 6/2016 | Lee et al. | |
| 2016/0300813 A1* | 10/2016 | Zhai | H01L 24/19 |
| 2016/0307847 A1 | 10/2016 | Lee et al. | |
| 2017/0103943 A1* | 4/2017 | Hu | H01L 23/31 |
| 2019/0051582 A1 | 2/2019 | Kim | |
| 2019/0096815 A1 | 3/2019 | Belonio, Jr. et al. | |
| 2020/0251350 A1* | 8/2020 | Gutierrez, III | H01L 23/5389 |
| 2020/0395313 A1* | 12/2020 | Mallik | H01L 23/5385 |

* cited by examiner

*Primary Examiner* — Latanya N Crawford Eason
(74) *Attorney, Agent, or Firm* — Saile Ackerman LLC; Stephen B. Ackerman; Rosemary L. S. Pike

(57) ABSTRACT

A molded interconnection substrate system in package is achieved comprising a molding compound having redistribution layers therein, at least one first active or passive component mounted on one side of the molded interconnection substrate and embedded in a top molding compound, at least one second active or passive component mounted in a cavity on an opposite side of the molded interconnection substrate wherein electrical connections are made between the at least one first active or passive component and the at least one second active or passive component through the redistribution layers and solder balls mounted in openings in the molded interconnection substrate to the redistribution layers wherein the solder balls provide package output.

15 Claims, 4 Drawing Sheets

INTEGRATED TYPE MIS SUBSTRATE FOR THIN DOUBLE SIDE SIP PACKAGE

RELATED PATENT APPLICATION

This disclosure is related to U.S. patent application Ser. No. 15/718,080 filed on Sep. 28, 2017, assigned to the same assignee as the present disclosure, and herein incorporated by reference in its entirety.

(1) TECHNICAL FIELD

This disclosure is related to system in package (SIP) technologies, and more particularly, to low cost and ultra thin SIP technologies.

(2) BACKGROUND

The internet of things (IOT) involves billions of mobile devices connected to the cloud with infinite possibilities for data. Each of these devices, whether mobile devices, wearable devices, or IOT devices, will require, at a minimum, a microcontroller to add intelligence to the device, one or more sensors to allow for data collection, one or more chips to allow for connectivity and data transmission, and a memory component. Semiconductor device manufacturers are constantly confronted with device integration challenges as consumers want electronics to be smaller, more portable and more multi-functional than ever.

One promising technology is Embedded Trace Substrate—System in Package (ETS-SiP) which integrates a Si die and passive components via a molding compound material with an ETS substrate as the interconnection between the top and bottom sides of the package. This technique is taught in co-pending U.S. patent application Ser. No. 15/718,080. After the die and passive components have been mounted to the substrate and encapsulated with molding compound, through mold vias (TMV) are formed, usually by laser ablation, and solder balls are placed to complete the interconnection between the topside devices and bottom side die and as the input/output (I/O) connection for the final structure. FIG. 1 illustrates the ETS-SiP having ETS substrate 100 with redistribution layers 102, top side passive components 104 encapsulated with top molding compound 106, bottom side silicon die 108 encapsulated with bottom molding compound 110, and solder balls 112 for I/O for the final structure.

U.S. Pat. No. 9,565,774 (Lee) and U.S. Patent Applications 2016/0307847 (Lee et al) and 2016/0174381 (Lee et al) disclose methods of forming and using embedded trace substrates (ETS). U.S. Pat. No. 10,276,424 (See et al) and U.S. Pat. No. 10,204,863 (Chen et al) and U.S. Patent Application 2019/0051582 (Kim et al) show various mold substrates.

SUMMARY

It is the primary objective of the present disclosure to apply SIP technologies to enable low cost integration of packages on wearable, mobile, and IOT devices.

It is a further objective of the present disclosure to integrate active and passive components with a molded interconnection substrate having at least one cavity and through mold via openings for solder balls pre-prepared.

Yet another objective is to provide an improved package having lower cost, smaller size, and better performance by integrating active and passive components with a molded interconnection substrate having at least one cavity and through mold via openings for solder balls pre-prepared.

A still further objective is to provide a method for making an improved package having lower cost, smaller size, and better performance by integrating active and passive components with a molded interconnection substrate having at least one cavity and through mold via openings for solder balls pre-prepared.

In accordance with the objectives of the present disclosure, a molded interconnection substrate system in package is achieved. The system in package comprises a molded interconnection substrate comprising a molding compound having redistribution layers therein, at least one first active or passive component mounted on one side of the molded interconnection substrate and embedded in a top molding compound, at least one second active or passive component mounted in a cavity on an opposite side of the molded interconnection substrate wherein electrical connections are made between the at least one first active or passive component and the at least one second active or passive component through the redistribution layers, and solder balls mounted in openings in the molded interconnection substrate to the redistribution layers wherein the solder balls provide package output.

Also in accordance with the objectives of the present disclosure, a method to fabricate a system in package is achieved. A molded interconnection substrate is provided comprising a molding compound having redistribution layers therein, at least one opening to a topmost redistribution layer on a topside of the molded interconnection substrate, having at least one cavity in a bottom side of the molded interconnection substrate contacting a bottommost redistribution layer, and having a plurality of through mold via openings in the bottom side of the molded interconnection substrate contacting the bottommost said redistribution layer. At least one first active or passive component is mounted in the at least one opening on the topside of the molded interconnection substrate and embedded in a top molding compound. Thereafter, the top molding compound is ground until a desired thickness has been reached. At least one second active or passive component is mounted in the at least one cavity and solder balls are mounted in the plurality of through mold via openings wherein the solder balls provide package output.

BRIEF DESCRIPTION OF THE DRAWINGS

In the accompanying drawings forming a material part of this description, there is shown.

DETAILED DESCRIPTION

The present disclosure integrates active and passive components on both sides with MIS (Molded Interconnection Substrate) as the interconnection between both sides. Multiple redistribution layers are embedded in the epoxy molding compound (EMC) of the MIS. Solder ball attachment through pre-drilled through mold vias assures the signal communication between top side devices and bottom side devices can be delivered to the bottom solder balls as the output. Better heat dissipation and electrical performance (parasitic capacitance and resistance) can be expected through this MIS structure due to a shorter distance between die and the printed circuit board (PCB) connected to the solder balls and shorter signal lines connection between the copper traces and the solder balls compared with a traditional package type.

The through mold via (TMV) process is considered to be one of the bottlenecks in the Outsourced Assembly and Test (OSAT) process which needs a longer cycle time for laser drilling individual holes as well as very expensive equipment. The present disclosure improves the process and package of co-pending U.S. patent application Ser. No. 15/718,080 by developing a new integrated structure SiP that will decrease the process step and cycle time in OSAT assembly.

Benefits of Molded Interconnection Substrate (MIS) technology include:

MIS substrate using epoxy molding compound (EMC) as a stackup material can approach ultra-thin thickness Lower raw material cost, higher reliability performance due to simple material interface (Cu+EMC) and lower water absorption rate.

MIS substrate and topside and bottom side molding of the SiP are all composed of EMC which will mitigate the substrate coefficient of thermal expansion (CTE) mismatch The primary objective of the present disclosure is to develop the multilayer MIS substrate with specific cavity area design and TMV (Through Molded Via) opening integrated structure. According to this concept, the substrate supplier will perform the cavity area etching process (either chemical or laser etching) and ball pad through mold via using a laser ablation process, for example. This manufacturing can utilize existing technology from substrate suppliers. This means the integrated type MIS substrate can be prepared in advance and then shipped, thus decreasing the cycle time in the OSAT assembly process.

Figure 1:
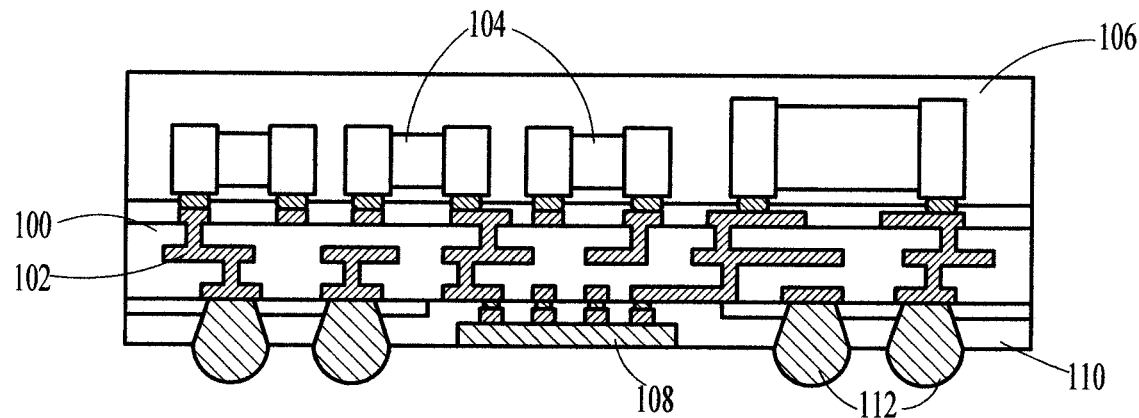
FIG. 1 is a cross-sectional representation of a system in package of the prior art.
Figure 2:
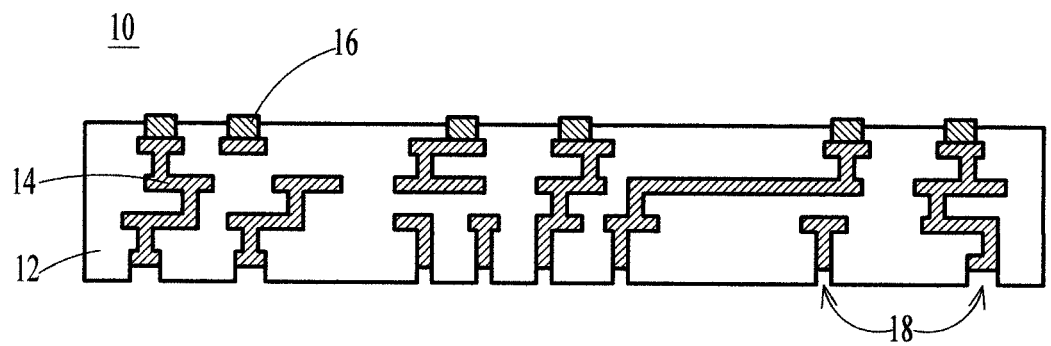
FIGS. 2 through 5 are cross-sectional representations of steps in a process to fabricate the mold interconnection substrate of the present disclosure.

FIG. 2 illustrates a MIS substrate provided by a supplier as used, for example, in co-pending U.S. patent application Ser. No. 15,718,080. The EMC substrate 10 includes EMC material 12 in which metal redistribution layers 14, such as Cu, have been formed. There may be three or more redistribution layers or fewer than three redistribution layers. Typically, the top side of the MIS substrate has a substrate finish material 16, such as organic solderability preservative (OSP). Openings 18 are made to the redistribution layer at the bottom side of the MIS substrate.

Figure 3:
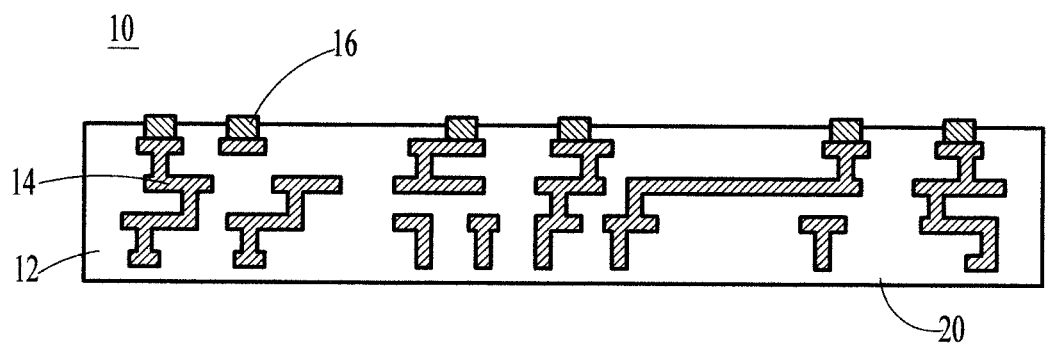
Figure 4:
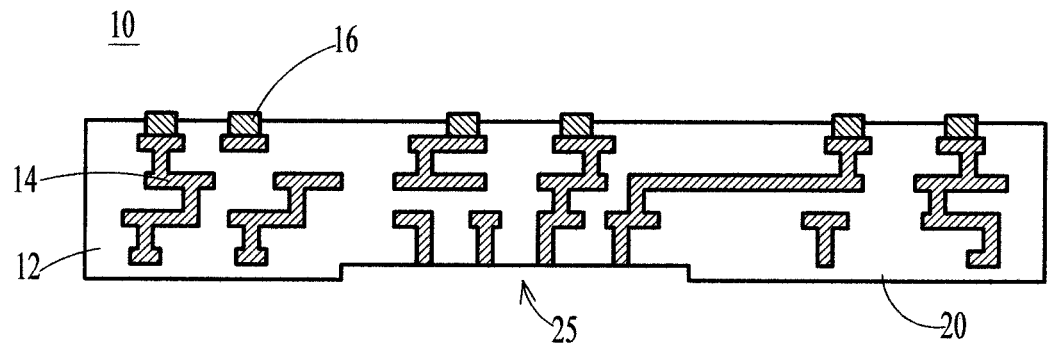
Figure 5:
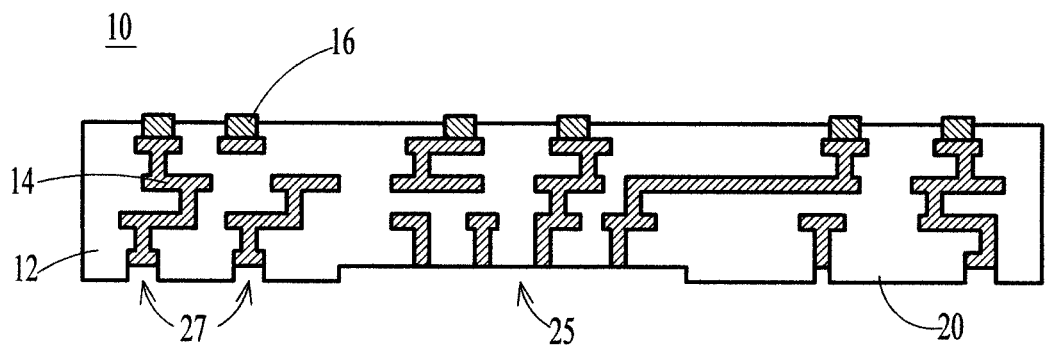

The substrate supplier will prepare the integrated MIS substrate of the present disclosure according to the steps illustrated in FIGS. 2-5. Beginning with the conventional EMC substrate 10 of FIG. 2, an additional molding process is performed to fill the openings 18 on the bottom side of the MIS substrate, as illustrated in FIG. 3. Next, as shown in FIG. 4, one or more cavity areas 25 are formed in the bottom side of the MIS substrate contacting a bottommost redistribution layer 14. Finally, through mold via openings 27 are formed such as by laser ablation at defined ball pad locations on the bottom side of the MIS substrate, as shown in FIG. 5. This completes the integrated MIS formation that is shipped to the OSAT for assembly processing.

Figure 6:
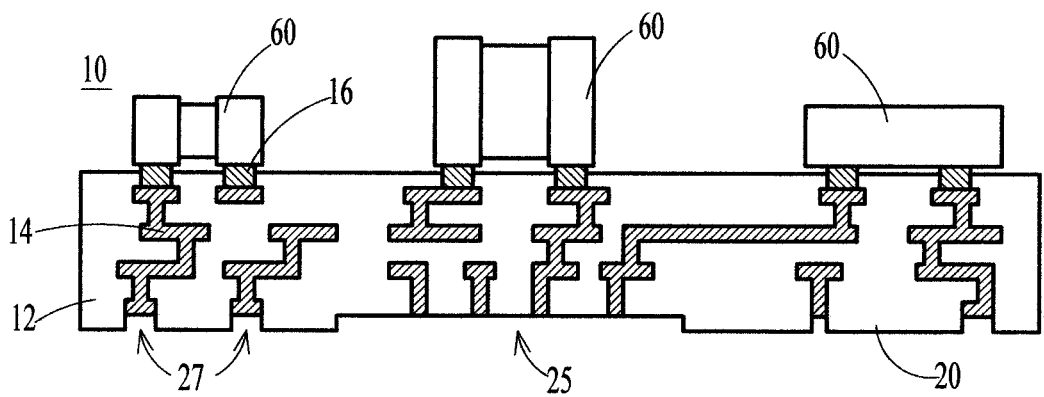
FIGS. 6 through 8 are cross-sectional representations of steps in a top side process flow to fabricate the system in package of the present disclosure.
Figure 7:
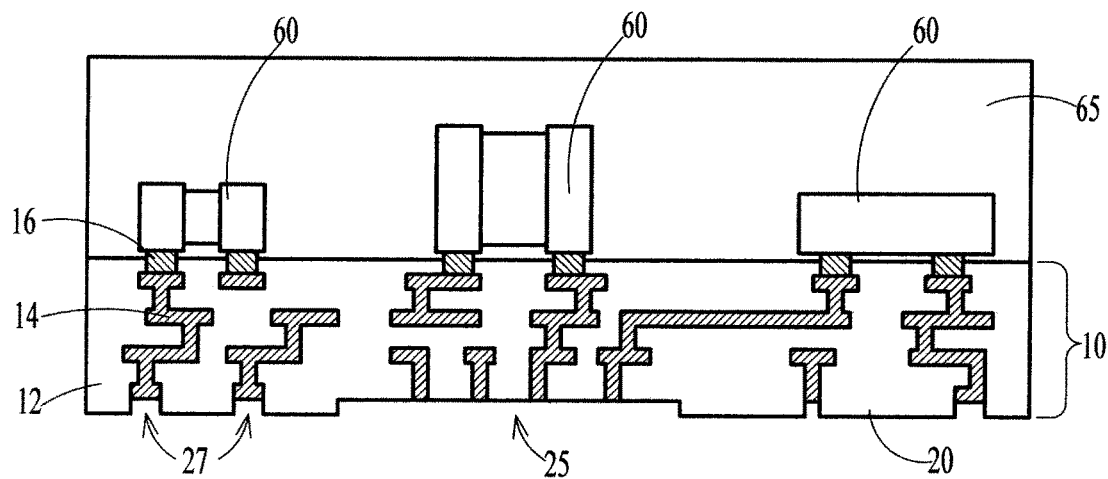
Figure 8:
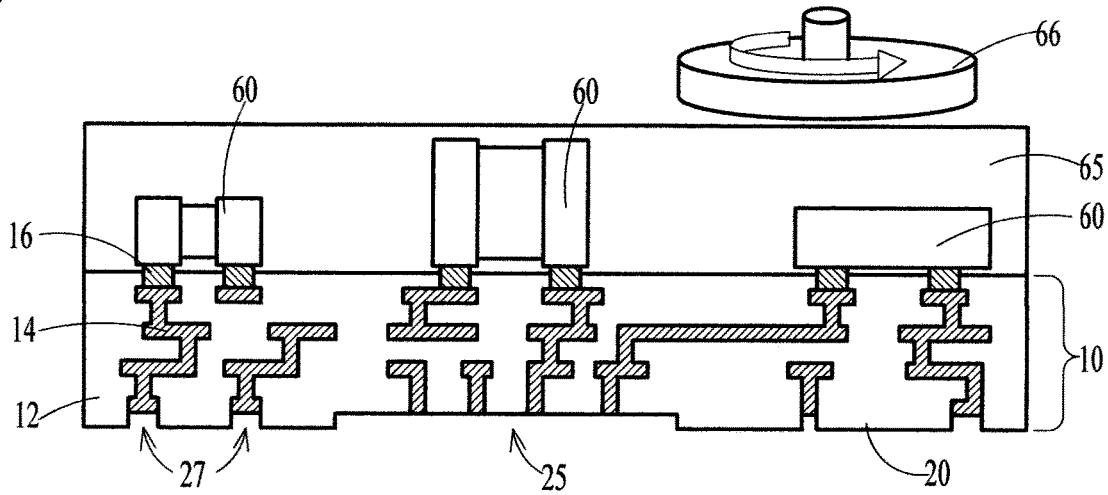

Next, top side assembly processing is performed using the provided MIS substrate, as illustrated in FIGS. 6-8. Referring more particularly to FIG. 6, passive components 60, such as resistors, capacitors, and inductors, for example, are mounted onto the top side of the integrated MIS 10 using surface mount technology (SMT) and die bonding. Active components such as integrated circuit chips could also be mounted on the top side of the substrate 10. Then, as shown in FIG. 7, a top compression molding process is performed using molding compound 65 to mold the substrate strip. The critical target is to control the precision of passive component and chip locations and the molding performance of the EMC compound. Next, as illustrated in FIG. 8, top mold grinding 66 is performed to approach the top side target thickness as well as to improve the warpage of the package and process and assembly handling during subsequent process steps. This completes the top side assembly process.

Figure 9:
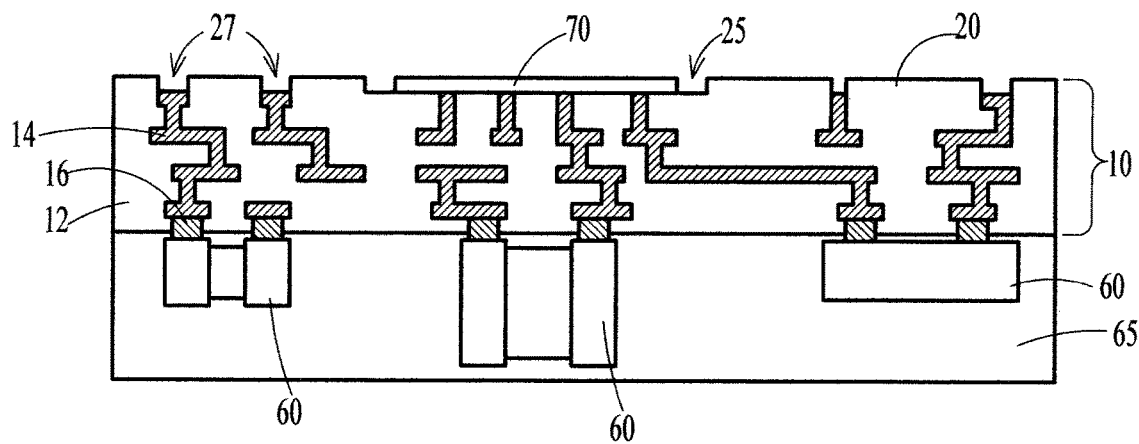
FIGS. 9 through 11 are cross-sectional representations of steps in a bottom side process flow to fabricate the system in package of the present disclosure.
Figure 10:
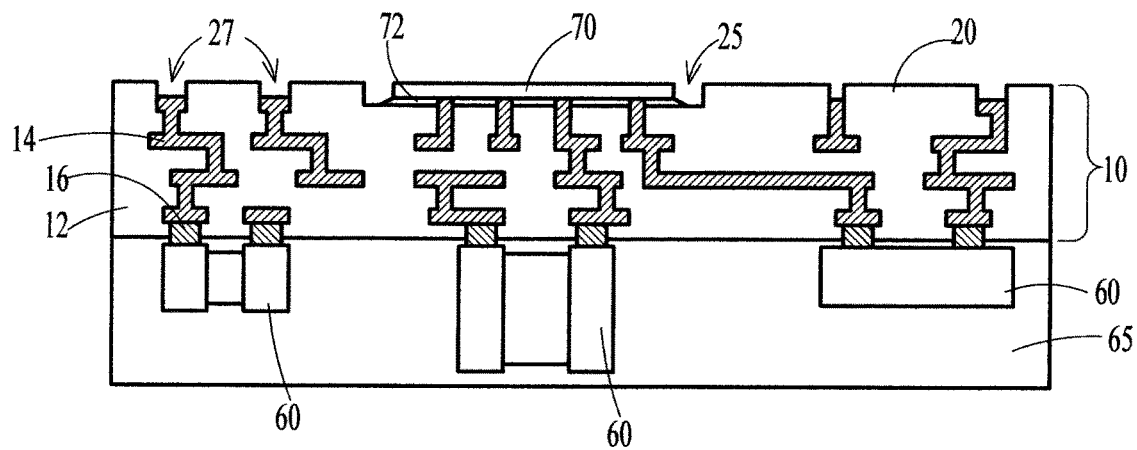
Figure 11:
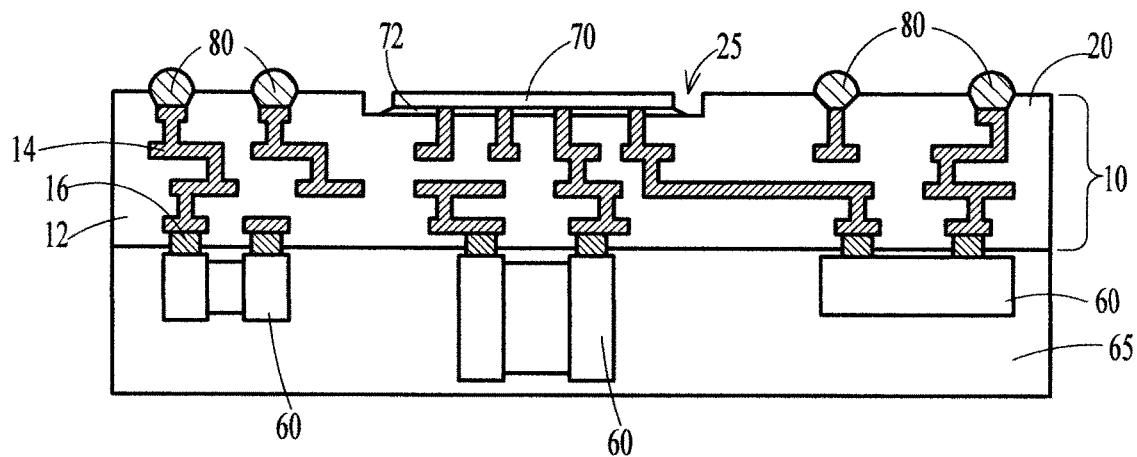

The bottom side assembly process will now be described with reference to FIGS. 9-11. The package is flipped over so that the top side of the package is at the bottom of FIG. 9. Silicon dies or passive components 70 are die attached or mounted into the one or more cavities 25, directly connecting to the exposed redistribution layer 14 within the cavities. Next, as shown in FIG. 10, an underfill process may be used to protect the flip chip die and bump attach with underfill 72. Next, as shown in FIG. 11, solder balls 80 are placed in the TMV's 27 already prepared.

This completes the bottom side assembly process. Compared to the original ETS-SiP process flow of co-pending U.S. patent application Ser. No. 15/718,080, the MIS-SiP process of the present disclosure will remove bottom molding, bottom mold grinding, and laser ablation. These three steps are major bottlenecks and the most expensive processes in the OSAT assembly.

Figure 12:
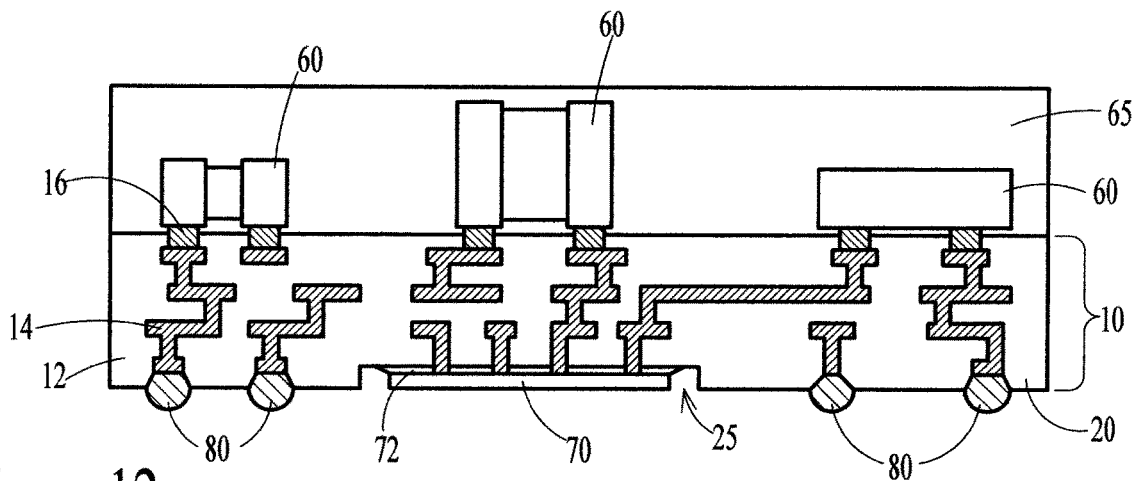
FIG. 12 is a cross-sectional representation of a system in package of the present disclosure.

FIG. 12 illustrates the completed MIS-SiP of the present disclosure comprising MIS 10 having redistribution layers 14 therein, active and/or passive components 60 on a top side of the package encapsulated in a top molding compound, active or passive components 70 in one or more cavities on a bottom side of said MIS, and solder balls 80 on the bottom side of the MIS in through-mold via openings to the bottommost redistribution layer 14.

In summary, with this new integrated type MIS substrate, MIS-SiP will further improve the process capability, cost, and cycle time. Additional advantages of the invention compared to current practices include:

Integration of various function chips and passive components

Reduction of the X-Y package dimension by double sided structure

Thinner substrate thickness and well controlled thickness tolerance by the substrate supplier Reduction of the substrate cost and improvement of the substrate reliability performance.

Mitigation of the CTE mismatch and improvement in the warpage performance.

Integrated specific cavity area to lower the Z-height

Integrated laser through mold via from substrate process which will decrease the OSAT assembly process cycle time and cost.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A system in package comprising:
    a molded interconnection substrate comprising a molding compound having metal redistribution layers embedded therein;
    at least one first active or passive component mounted on one side of said molded interconnection substrate and embedded in and covered by a top molding compound;
    at least one second active or passive component mounted in a cavity on an opposite side of said molded interconnection substrate wherein electrical connections are made between said at least one first active or passive component and said at least one second active or passive component through said metal redistribution layers; and
    solder balls mounted in openings in said molded interconnection substrate to said metal redistribution layers wherein said solder balls provide package output.

2. The system in package according to claim 1 wherein said metal redistribution layers comprise copper.

3. The system in package according to claim 1 wherein there are three said metal redistribution layers.

4. The system in package according to claim 1 wherein said top molding compound comprises a same material as said molding compound of said molded interconnection substrate.

5. The system in package according to claim 1 wherein said top molding compound and said molding compound of said molded interconnection substrate are epoxy molding compound.

6. A method to fabricate a system in package comprising:
    providing a molded interconnection substrate comprising:
        a molding compound having metal redistribution layers embedded therein;
        at least one opening to a topmost said metal redistribution layer on a topside of said molded interconnection substrate;
        at least one cavity in a bottom side of said molded interconnection substrate, contacting a bottommost said metal redistribution layer; and
        a plurality of through mold via openings in said bottom side of said molded interconnection substrate contacting said bottommost said metal redistribution layer;
    mounting at least one first active or passive component in said at least one opening on said topside of said molded interconnection substrate;
    embedding said at least one first active or passive component in a top molding compound;
    thereafter grinding said top molding compound until a desired thickness has been reached while still covering said at least one first active or passive component with said molding compound;
    mounting at least one second active or passive component in said at least one cavity; and
    mounting solder balls in said plurality of through mold via openings wherein said solder balls provide package output.

7. The method according to claim 6 wherein said metal redistribution layers comprise copper.

8. The method according to claim 6 wherein there are three said metal redistribution layers.

9. The method according to claim 6 wherein said top molding compound comprises a same material as said molding compound of said molded interconnection substrate.

10. The method according to claim 6 wherein said top molding compound and said molding compound of said molded interconnection substrate are epoxy molding compound.

11. A system in package comprising:
    a molded interconnection substrate comprising:
        a molding compound having metal redistribution layers embedded therein;
        at least one opening to a topmost said redistribution layer on a topside of said molded interconnection substrate;
        at least one cavity in a bottom side of said molded interconnection substrate, contacting a bottommost said metal redistribution layer; and
        a plurality of through mold via openings in said bottom side of said molded interconnection substrate contacting said bottommost said metal redistribution layer;
    at least one first active or passive component mounted in said at least one opening on said topside of said molded interconnection substrate and embedded in and covered by a top molding compound;
    at least one second active or passive component mounted in said at least one cavity wherein electrical connections are made between said at least one first active or passive component and said at least one second active or passive component through said metal redistribution layers; and
    solder balls mounted in said plurality of through mold via openings wherein said solder balls provide package output.

12. The system in package according to claim 11 wherein said metal redistribution layers comprises copper.

13. The system in package according to claim 11 wherein there are three said metal redistribution layers.

14. The system in package according to claim 11 wherein said top molding compound comprises a same material as said molding compound of said molded interconnection substrate.

15. The system in package according to claim 11 wherein said top molding compound and said molding compound of said molded interconnection substrate are epoxy molding compound.

* * * * *